US00RE37352B1

(19) United States
(12) Reissued Patent
Suzuki et al.

(10) Patent Number: US RE37,352 E
(45) Date of Reissued Patent: *Sep. 4, 2001

(54) PROJECTION OPTICAL APPARATUS

(75) Inventors: Kazuaki Suzuki, Adachi-ku; Yukio Kakizaki, Konan-ku; Tetsuo Taniguchi, Yokohama, all of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

(21) Appl. No.: 08/687,029

(22) Filed: Jul. 25, 1996

Related U.S. Patent Documents

Reissue of:
(64) Patent No.: 5,337,097
Issued: Aug. 9, 1994
Appl. No.: 08/154,997
Filed: Nov. 19, 1993

U.S. Applications:
(63) Continuation of application No. 07/999,455, filed on Dec. 12, 1993, now abandoned, which is a continuation of application No. 07/859,238, filed on Mar. 26, 1992, now abandoned, which is a continuation of application No. 07/740,871, filed on Jul. 31, 1991, now abandoned, which is a continuation of application No. 07/464,621, filed on Jan. 3, 1990, now abandoned, which is a continuation of application No. 07/326,391, filed on Mar. 17, 1989, now abandoned, which is a continuation of application No. 06/945,648, filed on Dec. 23, 1986, now abandoned.

(30) Foreign Application Priority Data

Dec. 26, 1985 (JP) ..... 60-292286
Oct. 30, 1986 (JP) ..... 61-256986

(51) Int. Cl.[7] ..... G03B 27/34

(52) U.S. Cl. ..... 353/101; 353/122; 355/55

(58) Field of Search ..... 353/101, 122, 353/121; 355/52, 53, 55, 63, 67, 71

(56) References Cited

U.S. PATENT DOCUMENTS

| | | | |
|---|---|---|---|
| 3,549,250 | 12/1970 | Pantenburg | 353/101 |
| 3,719,419 | 3/1973 | Davee | 353/101 |
| 4,353,627 | 10/1982 | Maemori | 353/101 |
| 4,498,742 | 2/1985 | Uehara . | |
| 4,589,769 | 5/1986 | Matsuki | 355/71 |
| 4,666,273 | 5/1987 | Shimizu et al. | 353/101 |
| 4,668,077 | 5/1987 | Tanaka | 355/53 |

(List continued on next page.)

FOREIGN PATENT DOCUMENTS 59-155843 9/1984 (JP) .

OTHER PUBLICATIONS

English–language translation of JP–59–155843; "Exposing Apparatus", 5 pages.
SPIE vol. 174, Developments in Semiconductor Microlithography IV (1979), "Evaluation Methods in the Design Stage of Projection Lenses", Kano, pp. 48–53.

*Primary Examiner*—William Dowling
(74) *Attorney, Agent, or Firm*—Oliff & Berridge PLC

(57) ABSTRACT

A projection optical apparatus for projection an image of an object onto a workpiece, which is suitable for use, for example, as an exposure apparatus used in the manufacture of integrated circuits. The projection optical apparatus includes an image forming optical system whose optical characteristic is changed by the light energy supplied from the illuminated object. A change of the optical characteristic of the optical system is determined by the use of a predetermined parameter whereby when the distribution of the light energy on the pupil of the optical system is changed, the parameter is correct in such a manner that the change of the optical characteristic determined by the parameter is changed in correspondence to the change in the distribution of the light energy.

45 Claims, 5 Drawing Sheets

U.S. PATENT DOCUMENTS

| | | | |
|---|---|---|---|
| 4,669,842 | 6/1987 | Yomoda et al. | 353/101 |
| 4,676,614 | 6/1987 | Ohno | 353/101 |
| 4,690,528 | 9/1987 | Tanimoto et al. | 353/101 |
| 4,730,900 | 3/1988 | Uehara et al. | 355/55 |
| 4,739,373 | 4/1988 | Nishi et al. | 355/53 |
| 4,851,882 | 7/1989 | Takahashi et al. | 355/46 |
| 4,871,257 | 10/1989 | Suzuki et al. | 356/400 |
| 4,883,345 | 11/1989 | Anzai et al. . | |
| 5,262,822 | 11/1993 | Kosugi et al. | 355/53 |
| 5,337,097 | 8/1994 | Suzuki et al. | 353/101 |
| 5,424,803 | 6/1995 | Noguchi | 355/53 |
| 5,436,692 | 7/1995 | Noguchi | 355/53 |

PROJECTION OPTICAL APPARATUS

Matter enclosed in heavy brackets [ ] appears in the original patent but forms no part of this reissue specification; matter printed in italics indicates the additions made by reissue.

This application is a continuation of application Ser. No. 999,455, filed Dec. 12 1993, now abandoned, which is a continuation of application Ser. No. 859,238, filed Mar. 26, 1992, now abandoned, which is a continuation of application Ser. No. 740,871, filed Jul. 31, 1991, now abandoned, which is a continuation of application Ser. No. 464,621, filed Jan. 3, 1990, now abandoned, which is a continuation of application Ser. No. 326,391, filed Mar. 17, 1989, and now abandoned, which is a continuation of application Ser. No. 945,648, filed Dec. 23, 1986, and now abandoned.

BACKGROUND OF THE INVENTION

1. Field of the Invention

The present invention relates to projection optical apparatus for forming desired images, such as, exposure apparatus used in the fabrication of integrated circuits, and more particularly to improvements in the correction control of changes in the imaging characteristic of the apparatus.

2. Description of the Prior Art

One of the important optical characteristics of the projection optical apparatus, e.g., reduction projection exposure apparatus is the matching precision and a magnification error of the projection optical system is an important one of various factors which affect the matching precision.

In recent years, the scale of integration for integrated circuits has been improved with the resulting tendency toward the realization of finer patterns and consequently there has been an increasing demand for improvement in the matching precision. Thus, there has been a very high degree of necessity for maintaining the projection magnification at a desired value.

In this connection, the magnification of the projection optical apparatus varies in the vicinity of the desired magnification due to such causes as small temperature changes of the apparatus, small barometric changes and temperature changes of the atmosphere in the clean room in which the apparatus is installed or the projection of an energy beam to the projection optical system.

As a result, reduction projection exposure apparatus of the type employing a magnification correcting mechanism for effecting a fine adjustment of the magnification of the projection optical system and attaining the required magnification have recently been proposed. Such correction mechanisms have been so designed that as, for example, the spacing between a reticle and the projection lens is varied, the lens spacing in the projection lens is varied or the pressure in the suitable air chamber of the projection lens is adjusted as disclosed in U.S. patent application Ser. No. 656,777 filed on Oct. 1, 1984.

On the other hand, the focus of the exposure apparatus is also changed due to the similar reasons as the previously mentioned variation factors relating to the magnification. Thus, exposure apparatus employing focus correcting mechanisms have also been proposed.

Then, of these imaging characteristic changing factors the accumulation of heat due to the projection of an energy beam to the projection optical system is a heat diffusion phenomenon having a specific time constant. In the conventional exposure apparatus, the numerical apertures of their illuminating systems are generally constant in many cases. Thus, the manner in which the energy beam is incident to the projection optical system is fixed and the time constant of the heat diffusion is constant. As a result, the variation characteristics of the imaging characteristics, e.g., the magnification and focus, are constant and one and the same control method for their adjustment can be used.

In recent years, however, an exposure apparatus has been proposed in which the numerical aperture of the illuminating system is varied so as to obtain an improved resolving power for a specific pattern. The results of the experiments conducted on this exposure apparatus have shown that a change of the numerical aperture results in a change in the distribution of the illuminating light beam on the pupil of the projection optical system and therefore the time constant of the heat diffusion is also changed. Thus, there is a disadvantage that even if the previously mentioned control method relating to the constant time constant is applied, the imaging characteristic cannot be adjusted satisfactorily and it is impossible to deal with such change of the time constant.

Also, where the total amount of the incident energy beam to the projection optical system or the illuminance is measured on the image plane side of the projection optical system and the imaging characteristic is corrected by using the measured value as a parameter, the change is considered as a simple change in the incident energy quantity from the correction control point of view. Generally, while a change of the numerical aperture of the illuminating system results in the corresponding change in the illuminance at the image plane, the distribution of the light beam on the pupil, i.e., the energy density in the vicinity of the pupil plane, is also changed as mentioned previously. Thus, it is expected that not only the previously mentioned time constant but also the coefficient term of a model formula or the like for specifying the variation of the optical characteristic are changed. Therefor, there is a disadvantage that if such changes of the coefficient are not taken into consideration, the correction control is effected inaccurately.

SUMMARY OF THE INVENTION

It is the primary object of the present to provide a projection optical apparatus so designed that the variation of an imaging characteristic can be adjusted satisfactorily against changes in the distribution of an energy beam incident to a projection optical system.

Where a mask is illuminated by the light energy from a light source to form an image of the mask in the desired imaging condition on a workpiece through the projection optical system, the distribution of the light beam on the pupil of the projection optical system is changed as occasion demands.

In response to such change in the distribution of the light beam, a parameter (e.g., a time constant or coefficient) for determining a change of an optical characteristic of the projection optical system is corrected.

The desired change of the optical characteristic of the projection optical system is determined on the basis of the corrected parameter so that the imaging condition on the workpiece is corrected in accordance with the change of the optical characteristic. By virtue of this correction, the imaging condition is satisfactorily maintained in a desired condition even if the distribution of the light beam is changed.

DESCRIPTION OF THE PREFERRED EMBODIMENTS

Figure 1:
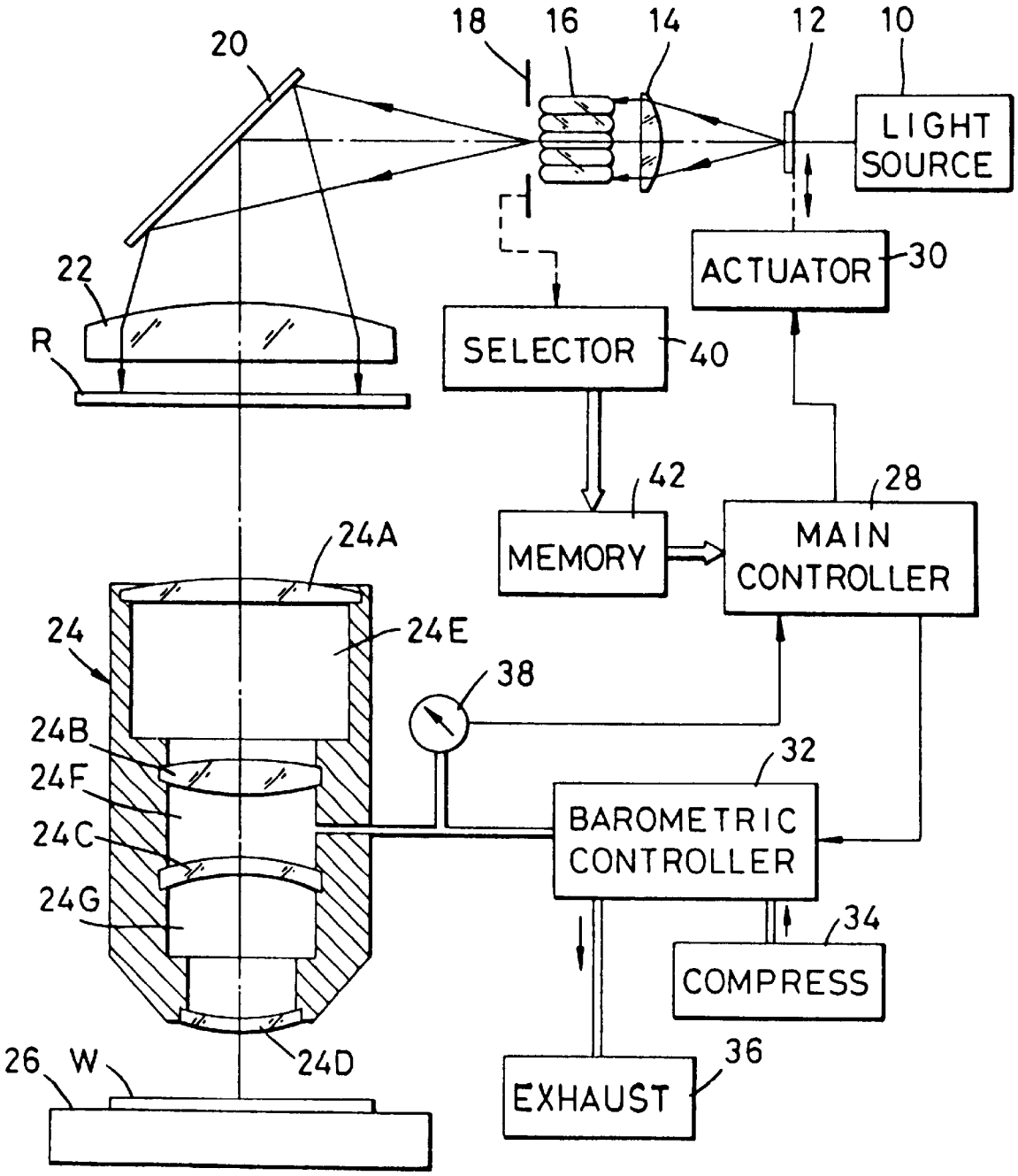
FIG. 1 is a block diagram showing a first embodiment of the present invention.

The overall construction of a first embodiment of the present invention will now be described with reference to FIG. 1. In FIG.. 1, the light emitted from a light source 10 for exposure illumination purposes falls on a lens 14 through a shutter 12 so that the light is collimated and then falls on an optical integrator of the type disclosed in U.S. Pat. No. 4,477,015 or fly-eye lens 16.

The light beam passed through the fly-eye lens 16 passes through an aperture stop 18 whose numerical aperture is automatically or manually adjustable and then the light beam falls on a dichroic mirror 20. Thus, the optical path of the light beam is bent downwardly so that the light beam falls on a main condenser lens 22 and illuminates uniformly a reticle R containing the required pattern. After passing through the reticle R, the light beam further passes through a projection lens 24 and reaches a wafer W on a stage 26, thereby projecting the pattern of the reticle R onto the wafer W. Note that the aperture stop 18 is arranged conjugate to the entrance pupil of the projection lens 24.

The projection lens 24 includes typical lens elements 24A, 24B, 24C and 24D and sealed lens chambers 24E, 24F and 24G are respectively defined by these lens elements. With these sealed lens chambers, the internal pressure of the sealed lens chamber 24F is controlled by means which will be described later, thereby controlling an imaging characteristic of the projection lens 24 for adjustment.

Next, its control system will be described. The imaging characteristic is controlled mainly by a main controller 28. The main controller 28 is connected to a shutter actuator 30. The actuator 30 controls the opening and closing of the shutter 12.

The sealed lens chamber 24F of the projection lens 24 is connected to a barometric controller 32 which in turn is connected to a compression system 34 for supplying compressed air and an exhaust system 36 for producing a vacuum, thereby controlling the internal pressure of the sealed lens chamber 24F through a suitable solenoid value. The sealed lens chamber 24F is also connected to a pressure sensor 38, and the pressure sensor 38 and the barometric controller 32 are connected to the main controller 28. Thus, the internal pressure of the sealed lens chamber 24F is detected and also the barometric controller 32 is operated by the main controller 28 so as to maintain the internal pressure at a given value.

The aperture stop 18 is connected to a selector 40 which in turn is connected to the main controller 28 through a memory 42. The selector 40 selects from the memory 42 a time constant corresponding to the g value of the illumination aperture stop 18 which will be described later. The memory 42 stores different time constants of change of the imaging characteristic which have preliminarily been determined by experiments in correspondence to different σ values or numerical apertures. The σ value corresponds to the degree of opening and is given as a ratio of the numerical aperture of the illuminating optical system to the object (reticle R) side numerical aperture of the projection optical system.

Figure 2A:
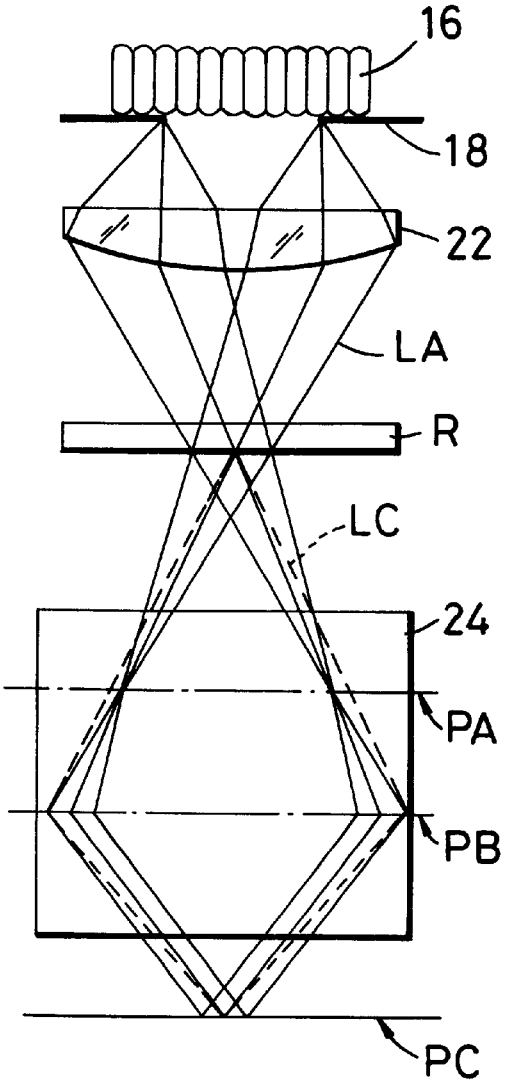
FIG. 2A and 2B are diagrams for explaining the distributions of light in two projection lenses which are set to different numerical apertures.
Figure 2B:
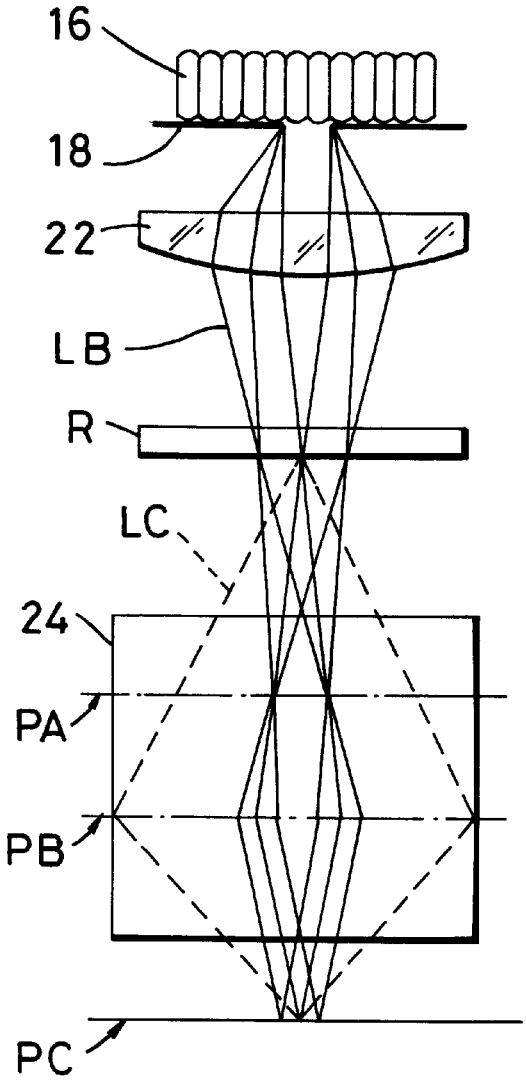

Next, the manner in which the light distribution in the projection optical system changes with changes of the numerical aperture will be described. FIGS. 2A and 2B show schematically the section of the illuminating optical system and the projecting optical system in the apparatus of FIG. 1.

The solid lines LA and LB show the paths of light beams. Symbol PA designates the position of the entrance pupil, PB the principal plane, and PC the image plane. The broken line LC shows the object side or image side aperture of the projecting optical system.

Figure 3:
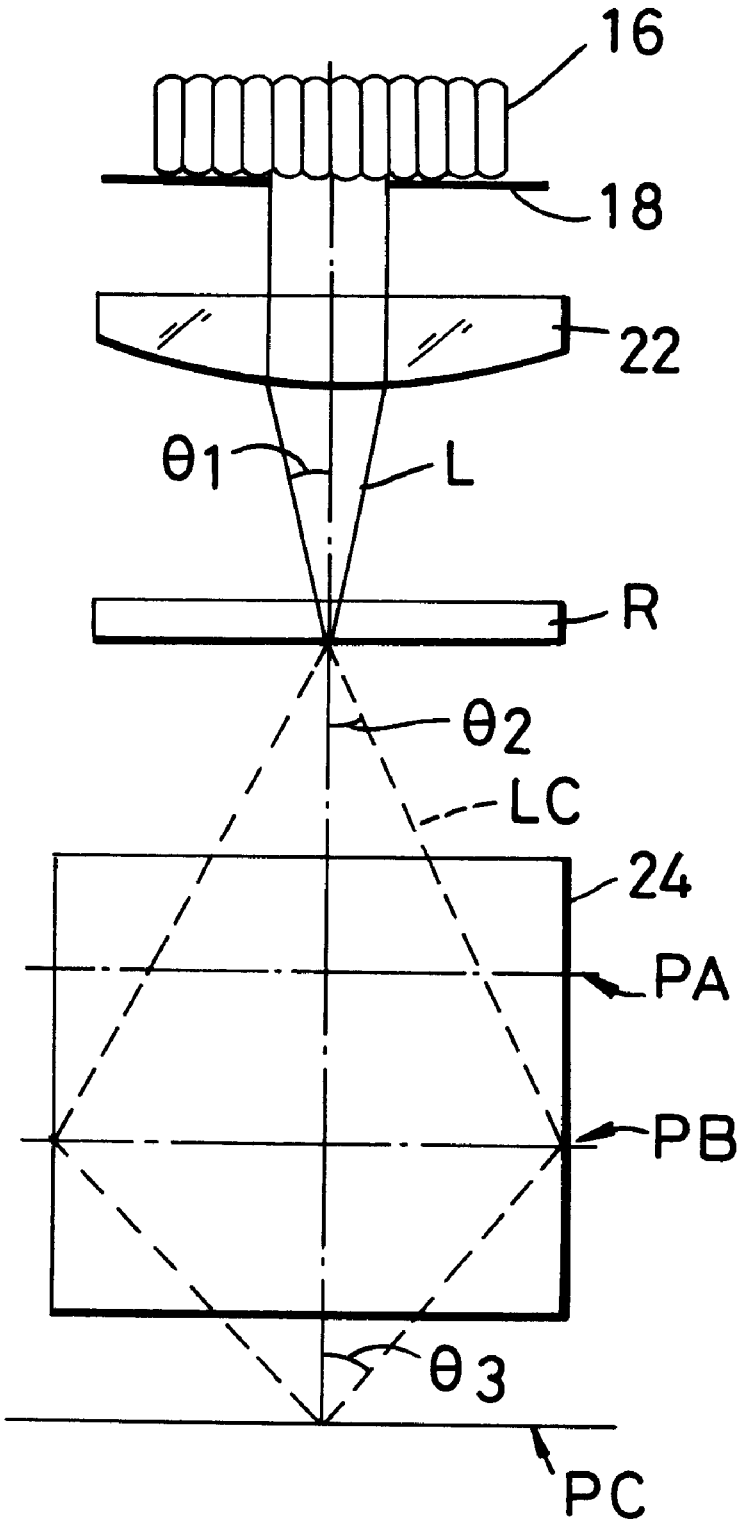
FIG. 3 is a diagram for explaining the numerical aperture.

The numerical aperture will now be explained with reference to FIG. 3. If $\theta_1$ represents the angle of the incident light L to the reticle R, $\theta_2$ the angle of the light transmitted through the reticle R, $\theta_3$ the angle of incidence of the light to the image plane PC and n the refraction index of air with respect to vacuum, the numerical aperture of the illuminating optical system or the numerical aperture on the incident side to the reticle R is given by $n\text{-}\sin\theta_1$ and similarly the numerical apertures of the projection optical system or the projection lens 24 on the reticle R side and the image plane PC side are respectively given by $n\text{-}\sin\theta_2$ and $n\text{-}\sin\theta_3$. Since the refractive index n is usually 1, practically these numerical apertures are given by $\sin\theta_1$, $\sin\theta_2$ and $\sin\theta_3$, respectively.

FIG. 2A shows the case where the aperture stop 18 has a relatively wide opening and the numerical aperture is also large. As shown in the FIG. 2A, of the illuminating light beam concentrating at three points on the reticle R, the zero-order beam travels straight without diffraction and its path LA up to the image formation spreads throughout the inside of the projection lens 24.

On the other hand, FIG. 2B shows the case where the aperture stop 18 is closed relatively and the numerical aperture is small. In this case, as will be seen from the path LB of the zero-order beam, the light beam concentrates around the optical path inside the projection lens 24. In this case, while the light beam spreads to the outside of the illustrated extent due to the presence of the diffracted light at the surface of the reticle R, even if this point is considered, the light beam tends to concentrate around the optical axis as compared with the case where the numerical aperture is large.

From the foregoing it will be seen that the light beam distribution or the light image area at the pupil position PA (or the principal plane position PB) in the projection lens 24 changes with changes of the numerical aperture or the σ value of the illuminating optical system. Thus, when such change occurs in the light beam distribution, it causes a change in the time constant of change of the optical characteristic due to a temperature rise caused by the abortion of a portion of the light beam by the projection lens 24.

Figure 4:
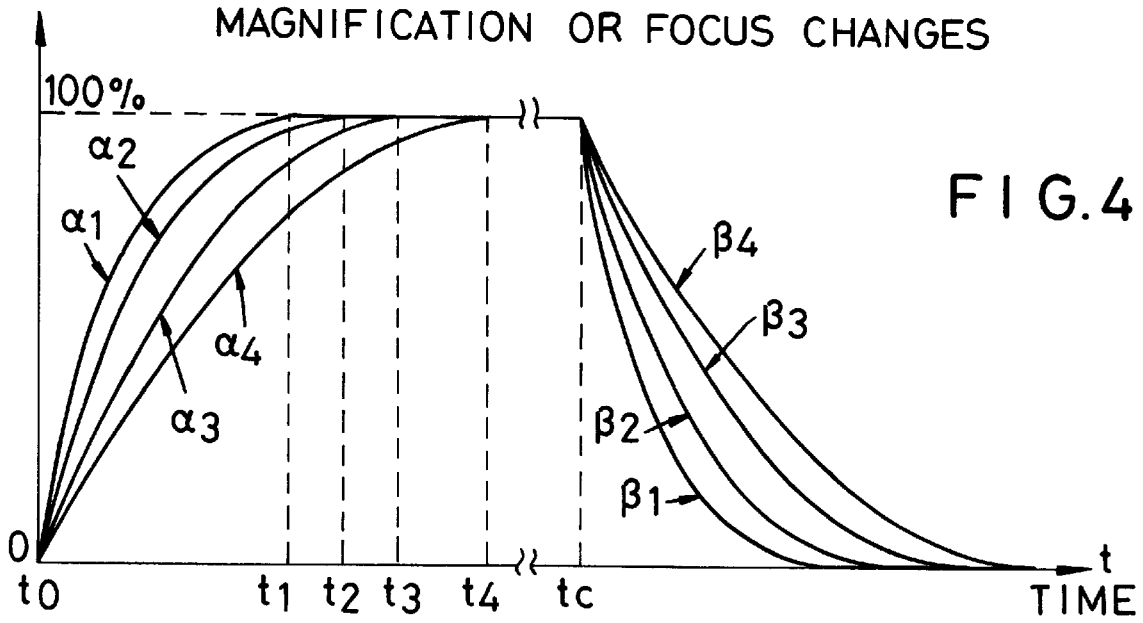
FIG. 4 is a graph showing how the imaging characteristic changes with changes of the numerical aperture.

The selector 40 and the memory 42 will now be described. As mentioned previously, the time constant of change of the optical characteristic is varied with changes of the opening or the σ value of the illuminating aperture stop 18. FIG. 4 shows the variation with time of the magnification (or focus)

changes of the projection lens 24 obtained by varying the σ value as a parameter. Note that the changes are shown in normalized form with the saturation point as 100%. In FIG. 4, four exemplary cases for different σ values are respectively shown as characteristics $\alpha_1$, $\alpha_2$, $\alpha_3$,and $\alpha_4$. The shutter 12 is opened from a time $t_o$ to a time $t_c$ and it is closed from the time $t_c$ onward. With the characteristic $\alpha_1$ for the maximum σ value, the saturation point is attained at the time $t_1$, whereas the saturation point is reached at the times $t_2$, $t_3$ and $t_4$ for the characteristics $\alpha_2$, $\alpha_3$ and $\alpha_4$, respectively. From the time $t_c$ on, the four cases differ in the rate of decrease from one another as shown by characteristics $\beta_1$ to $\beta_4$. In this way, the time constant of change of the imaging characteristic is varied with changes of the σ value corresponding to the numerical aperture. Thus, as shown in Table 1, preliminarily the corresponding imaging characteristic change data to different values of the σ value or the numerical aperture of the aperture stop 18 are obtained and the corresponding time constants Ti are determined. These time constants Ri are stored in the memory 42 and they are selectively supplied to the main controller 28 by the selector 40 as occasion demands.

TABLE 1

| Numerical aperture | Time constant |
|---|---|
| 0.1 | $T_1$ |
| 0.2 | $T_2$ |
| 0.3 | $T_3$ |
| 0.4 | $T_4$ |
| 0.5 | $T_5$ |
| 0.6 | $T_6$ |
| 0.7 | $T_7$ |
| 0.8 | $T_8$ |
| 0.9 | $T_9$ |
| 1.0 | $T_{10}$ |

The overall operation of the embodiment will now be described. Firstly, the illuminating lift emitted from the light source 10 falls on the lens 14 in response to the opening and closing of the shutter 12 effected under the control of the actuator 30 so that the collimated light beam falls on the fly-eye lens 16 and it is transmitted through the aperture stop 18. At this time, the spread of the light beam is suitably adjusted in dependence on the magnitude of the σ value or the numerical aperture of the aperture stop 18. The illuminating light beam of the adjusted spread is projected onto the reticle R through the dichroic mirror 20 and the main condenser 22 and it is then transmitted through the projection lens 24 to reach the wafer W, thereby forming an image of the pattern of the reticle R on the wafer W.

On the other hand, the selector 40 selects from the memory 42 the time constant corresponding to the preset numerical aperture of the aperture stop 18 in accordance with the Table 1. For instance, the time constant $T_6$ is selected when the numerical aperture is 0.6. The selected time constant is supplied to the main controller 28 so that the desired magnification change is determined in accordance with this time constant as shown in FIG. 4. In accordance with this magnification change and the internal pressure of the sealed lens chamber 24F detected by the barometric sensor 38, the main controller 28 applies a control signal to the barometric controller 32. Thus the internal pressure of the sealed lens chamber 24F is controlled by means of the compression system 34 and the exhaust system 36. As a result of this control, the magnification of the projection lens 24 is controlled at a desired value. Any of the known methods of using the time constant for the variation characteristic of the projection lens 24 to control its internal pressure may be used, and more specifically the method disclosed in the previously mentioned U.S. patent application may be used. It is to be noted that the selector 40 may be manually operated at the discretion of the operator to receive an input.

Figure 5:
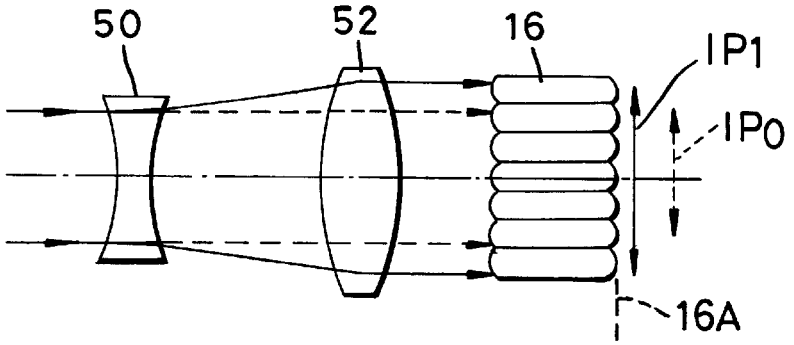
FIG. 5 and 6 are diagrams for explaining the optical systems required respectively for increasing and decreasing the numerical aperture.

The aperture stop 18 may be replaced with a group of lenses forming a Galileian system such as disclosed in U.S. Pat. No. 4,498,742. FIG. 5 shows an example in which the numerical aperture is increased. More specifically, a Galileian system including a concave lens 50 and a convex lens 52 is arranged on the incident side of the fly-eye lens 16 so as to expand the illuminating light beam collimated by the lens 14. Where no Galileian system is arranged, the illuminating light beam becomes as shown by the broken lines in FIG. 5 and the size of a second-order light source image is IPo. This image is formed on an image plane 16A positioned conjugate to the pupil of the projection lens 24. Where the Galileian system is arranged, the illuminating light beam becomes as shown by the solid lines in FIG. 5 and the size of a second-order light source image becomes $IP_1$, thereby increasing the numerical aperture.

Figure 6:
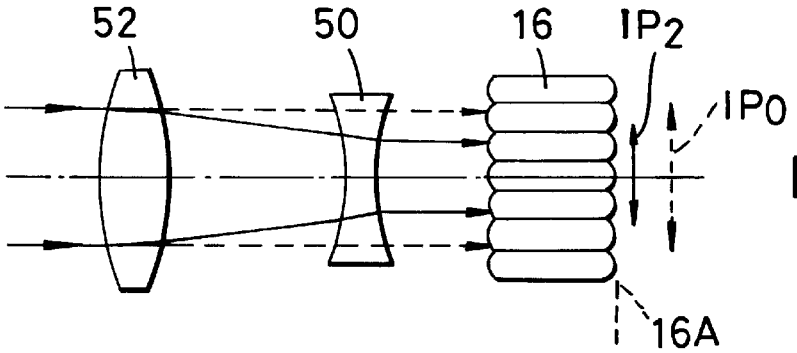

On the other hand, where the concave lens 50 and the convex lens 52 are interchanged with each other as shown in FIG. 6, the illuminating light beam becomes as shown by the solid lines in FIG. 6 and the size of a second-order light source image becomes $IP_2$, thereby producing the same condition as if the numerical aperture were decreased.

By using these arrangements, it is possible to vary the σ value of the illuminating optical system without using the aperture stop 18 and this has the effect of preventing any vignetting and improving the illumination efficiency. If it is desired to vary the o value continuously, this can be accomplished by arranging a zoom lens system in front of the fly-eye lens 16.

Figure 7:
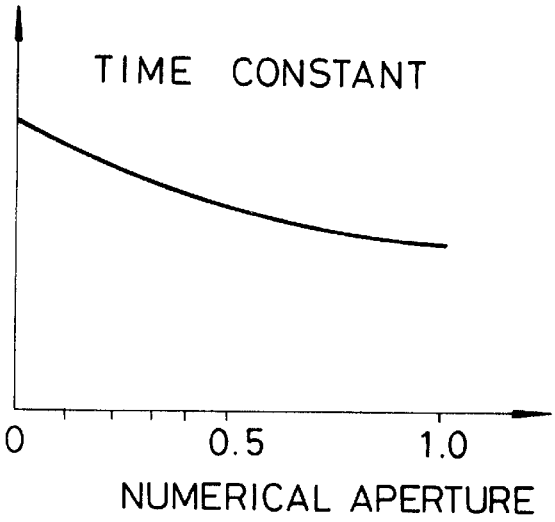
FIG. 7 is a graph showing how the time constant changes with changes of the numerical aperture.
Figure 9:
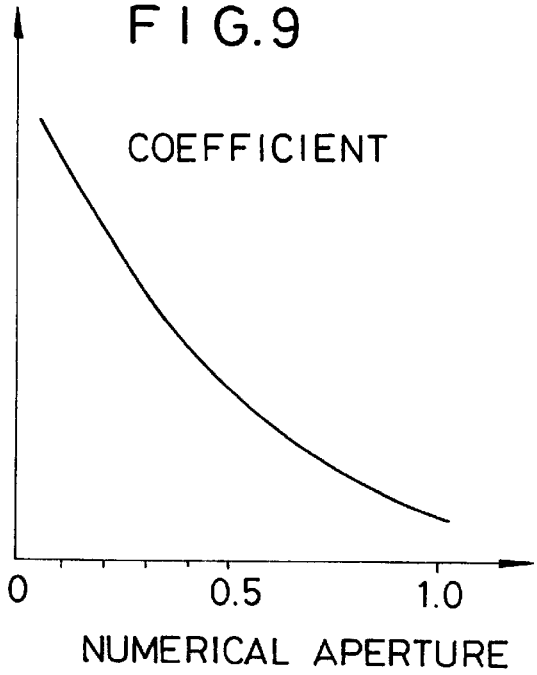
FIG. 9 is a graph showing how the coefficient changes with changes of the numerical aperture(σ value).

Instead of storing the relation between the numerical aperture and the time constant in the form of Table 1 in the memory 42, it is possible to approximate the relation between the numerical aperture and the time constant with a suitable function, e.g., n-order function as shown in FIG. 7, and store the function in the memory 42. Then, the corresponding time constant will be determined by calculation from the preset numerical aperture. In this case, the selector 40 functions as a means for inputting a change of the numerical aperture.

Thus, it is possible to deal with cases where the numerical aperture is changed stepwise as well as cases where the numerical aperture is changed continuously.

While, in the above-described embodiment, the single time constant is used to represent the change of the imaging characteristic, there are cases where two or more parameters are used to represent a variable characteristic (e.g., attenuation characteristic). In this case, the required two or more parameters are related to the respective numerical apertures. For instance, in the case shown in Table 1, the required numbers of parameters (time constants) are stored in the memory 42 in the form of $T_1$, $T_2$, $T_3$, - - -. In the case of FIG. 7, the functions of the required number of parameters are stored in the memory 42. Also, there is the correspondence between the numerical aperture and the σ value and either of them may be used, Assume that ΔP represents a change of the magnification or focus, i.e., a variable characteristic, with respect to the instantaneous energy beam projection, $T_1$, $T_2$, $T_3$, ($T_1>T_2>T_3$) time constants and $a_1$, $a_2$, $a_3$ coefficients, thus establishing the following equation $$\Delta P = \sum_{i=1}^{3} ai \cdot e^{-\mu Ti}$$

In this case, if it is also necessary to make a correction for the coefficient ai, it is only necessary to similarly change the coefficient ai in correspondence to the numerical aperture (or the σ value).

Figure 8:
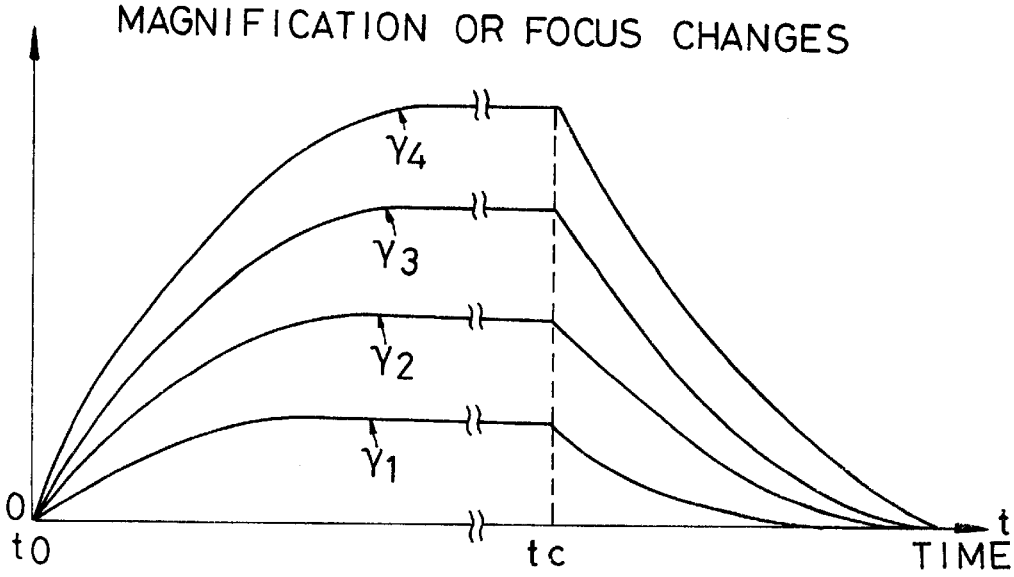
FIG. 8 is a graph showing how the imaging characteristic changes with changes of the numerical aperture.

While the above-described embodiment is mainly concerned with changes of the time constant, there are cases where practically no change occurs in the time constant even if the σ value is changed, FIG. 8 shows four different variation characteristics of the magnification (or the focus) in a case where the value of the aperture stop 18 is varied as a parameter while maintaining constant the total incident quantity of the illuminating light to the projection lens 24 (the illuminance at the image plane). In FIG. 8, the abscissa represents the time t. The shutter 12 is opened from a time $t_o$ to a time $t_c$ and it is closed from the time $t_c$ on. In FIG. 8, the ordinate represents the variation of the magnification (or the focus).

These differences in characteristic are caused by different projection lens structures, lens glass materials, etc., and it is considered that a change of the o value does not practically cause the corresponding change of the time constant and it causes a change in the coefficient term serving as a parameter. In such a case, the imaging characteristic change data corresponding to a plurality of σ values (or numerical apertures) of the aperture stop 18 are preliminarily obtained as shown in Table 2, thereby determining and storing the coefficients Ci (corresponding to ai in the previously mentioned equation) corresponding to the σ values in the memory 42 shown in FIG. 1. Then, the selector 40 of FIG. 1 selects and sends a desired one of the coefficients Ci to the main controller 28.

TABLE 2

| Numerical aperture | Coefficient |
|---|---|
| 0.1 | $C_1$ |
| 0.2 | $C_2$ |
| 0.3 | $C_3$ |
| 0.4 | $C_4$ |
| 0.5 | $C_5$ |
| 0.6 | $C_6$ |
| 0.7 | $C_7$ |
| 0.8 | $C_8$ |
| 0.9 | $C_9$ |
| 1.0 | $C_{10}$ |

Also, as in the case of FIG. 7, the relation between the σ the coefficient Ci may be approximated by a suitable function, e.g., n-order function or a hyperbola, so as to store its functional formula in the memory 42 and determine the coefficient corresponding to the preset σ value of the illuminating optical system by calculation. Of course, the control may be effected by storing both of the time constants and the coefficients in the memory 42 and suitably reading either one or both of them in response to changes of the σ value.

Further, while, in the above-described embodiments, the method of correcting an optical characteristic of the projection lens 24 itself is used as a means of correcting the imaging condition, any other method may be used. For instance, if the reticle side of the projection lens 24 is nontelecentric, the magnification on the wafer W can be changed by automatically shifting the reticle R toward the optical axis. Therefore, by causing the amount of shift to change to follow up in accordance with the calculated variation characteristic, it is possible to always maintain the magnification at a constant value. Further, where changes in the focus of the projection lens 24 present difficulties, it is necessary to arrange so that the offset corresponding to the variation characteristic is applied to the automatic focusing mechanism which maintains the gap between the projection lens 24 and the wafer W constant and the presumed in-focus position of the wafer W is varied in response to a shift of the image plane of the projection lens 24 toward the optical axis. In other words, in accordance with the invention any method may be used provided that the imaging condition of the projected image on the wafer W is corrected.

Further, it is desired that when the shape of a light source image (e.g., an of the aperture stop) on the pupil of the projection lens changes from the circular shape to any other shape, the parameter such as the time constant or the coefficient is changed similarly.

Still further, where it is desired to change the numerical aperture (the size of the pupil) of the projection optical system itself by the stop or the Like, the same effect can be obtained by changing the parameter in the like manner as in the case where the numerical aperture of the illuminating optical system is changed. In this case, the selector 40 functions as a means of inputting a change of the numerical aperture (the σ value).

We claim:

1. Apparatus for projecting an image of an object along an optical axis onto a workpiece including, in combination, an illumination optical system, an optical lens system and a control system, with said illuminating optical system comprising:

light source means for generating a beam of light energy to illuminate said object;

shutter means for interrupting said beam of light energy at given time intervals with said interrupted beam reaching full illumination in each time interval over a time constant dependent upon the numerical aperture of said illumination optical system;

reticle means containing a pattern representing said *object*;

aperture means having an adjustable aperture;

means for adjusting the size of the aperture;

means for directing said beam of light energy through said aperture means and upon said reticle means for forming said image;

said optical lens system comprising means including a sealed pressurized lens chamber containing a plurality of lenses for projecting light onto said workpiece and having an optical characteristic responsive to an accumulation of heat in said pressurized lens chamber from said light energy, and said control system comprising means responsive to said aperture means for varying the light distribution to said optical lens system in accordance with changes in the numerical aperture of said illuminating optical system;

storage means for storing a plurality of time [constant] *constants* or coefficients of change, given as a ratio of the numerical aperture of the illumination optical system to the numerical aperture of the optical lens system, corresponding to a multiplicity of different numerical aperture sizes of said aperture means;

selector means responsive to said aperture means for selecting the time constant or coefficient of change from said storage means corresponding to the numerical aperture size of said aperture means; and means for controlling the pressure in said optical lens system corresponding to the selection of said time constant.

2. Apparatus for projecting an image of an object along an optical axis onto a workpiece including, in combination, an illumination optical system, an optical lens system and a control system, with said illuminating optical system comprising:

light source means for generating a beam of light energy to illuminate said object;

shutter means for interrupting said beam of light energy at given time intervals with said interrupted beam reaching full illumination in each time interval over a time constant dependent upon the numerical aperture of said illumination optical system;

reticle means containing a pattern representing said object;

aperture means having an adjustable aperture;

means for adjusting the size of the aperture;

means for directing said beam of light energy through said aperture means and upon said reticle means for forming said image;

said optical lens system comprising means including a seated pressurized lens chamber containing a plurality of lenses for projecting light onto said workpiece and having an optical characteristic responsive to an accumulation of heat in said pressurized lens chamber from said light energy, and said control system comprising means responsive to said aperture means for varying the light distribution to said optical lens system in accordance with changes in the numerical aperture of said illuminating optical system, storage means for storing a plurality of time constants or coefficients of change, given as a ratio of the numerical aperture of the illumination optical system to the numerical aperture of the optical lens system, corresponding to a multiplicity of different numerical aperture sizes of said aperture means; and selector means responsive to said aperture means for selecting the time constant or coefficient of change from said storage means corresponding to the numerical aperture size of said aperture means; and means for controlling the light distribution in said optical lens system corresponding to the selection of said time constant.

3. Apparatus for projecting an image of an object along an optical axis onto a workpiece including, in combination, an illumination optical system, an optical lens system and a control system, with said illuminating optical system comprising:

light source means for generating a beam of light energy to illuminate said object;

shutter means for interrupting said beam of light energy at given time intervals with said interrupted beam reaching full illumination in each time interval over a time constant dependent upon the numerical aperture of said illumination optical system;

reticle means containing a pattern representing said object;

aperture means having an adjustable aperture;

means for adjusting the size of the aperture;

means for directing said beam of light energy through said aperture means and upon said reticle means for forming said image;

said optical lens system comprising means including a sealed pressurized lens chamber containing a plurality of lenses for projecting light onto said workpiece and having an optical characteristic responsive to an accumulation of heat in said pressurized lens chamber from said light energy, and said control system comprising means responsive to said aperture means for varying the light distribution to said optical lens system in accordance with changes in the numerical aperture of said illuminating optical system, storage means for storing a plurality of time constants or coefficients of change, given as a ratio of the numerical aperture of the illumination optical system to the numerical aperture of the optical lens system, corresponding to a multiplicity of different numerical aperture sizes of said aperture means; and selector means for controlling said aperture means in a relationship corresponding to a selected time constant or coefficient of change in said storage means.

*4. Apparatus for projecting an image of an object along an optical axis onto a workpiece including an illumination optical system, an optical lens system and a control system, said illuminating optical system comprising:*

*a reticle device containing a pattern representing said object;*

*an aperture device having an adjustable aperture;*

*an adjusting device adjusting a size of the aperture;*

*said optical lens system having a sealed pressurized lens chamber projecting light onto said workpiece and having an optical characteristic responsive to an accumulation of heat in said pressurized lens chamber from said light energy,*

*a storage device that stores a plurality of time constants or coefficients of change, given as a ratio of a numerical aperture of the illumination optical system to a numerical aperture of the optical lens system, corresponding to a multiplicity of different numerical aperture sizes of said aperture device;*

*a selector device responsive to said aperture device that selects the time constant or coefficient of change from said storage device corresponding to the numerical aperture size of said aperture device; and*

*a control device that controls a pressure in said optical lens system corresponding to the selection of said time constant.*

*5. Apparatus for projecting an image of an object along an optical axis onto a workpiece including an illumination optical system, an optical lens system and a control system, said illuminating optical system comprising:*

*a reticle device containing a pattern representing said object;*

*an aperture device having an adjustable aperture;*

*an adjusting device adjusting a size of the aperture;*

*said optical lens system having a sealed pressurized lens chamber projecting light onto said workpiece and having an optical characteristic responsive to an accumulation of heat in said pressurized lens chamber from said light energy,*

*a storage device that stores a plurality of time constants or coefficients of change, given as a ratio of a numerical aperture of the illumination optical system to a numerical aperture of the optical lens system, corresponding to a multiplicity of different numerical aperture sizes of said aperture device; and*

*a selector device responsive to said aperture device that selects the time constant or coefficient of change from said storage device corresponding to the numerical aperture size of said aperture device; and*

*a control device that controls a light distribution in said optical lens system corresponding to the selection of said time constant.*

*6. Apparatus for projecting an image of an object along an optical axis onto a workpiece including an illumination optical system, an optical lens system and a control system, said illuminating optical system comprising:*

*a reticle device containing a pattern representing said object;*

*an aperture device having an adjustable aperture;*

*an adjusting device adjusting a size of the aperture;*

*said optical lens system having a sealed pressurized lens chamber projecting light onto said workpiece and having an optical characteristic responsive to an accumulation of heat in said pressurized lens chamber from said light energy,*

*a storage device that stores a plurality of time constants or coefficients of change, given as a ratio of a numerical aperture of the illumination optical system to a numerical aperture of the optical lens system, corresponding to a multiplicity of different numerical aperture sizes of said aperture device; and*

*a selector device controlling said aperture device in a relationship corresponding to a selected time constant or coefficient of change in said storage device.*

*7. A projection exposure apparatus comprising:*

*an illumination optical system that forms a secondary light source, of which a size or a shape is changed, with light from a primary light source to illuminate a pattern with light from the secondary light source;*

*a projection optical system that projects an image of the pattern on a substrate;*

*an imaging controller that adjusts an optical property of the projection optical system, using a plurality of constants corresponding to different sizes or shapes of secondary light sources; and*

*a processor that sets a constant selected in accordance with the changed size or shape of the secondary light source in the imaging controller so that a change in the optical property caused by the change of the size or the shape of the secondary light source is substantially corrected.*

*8. An apparatus according to claim 7, wherein said imaging controller calculates the change in said optical property by using said selected constant and adjusts said optical property based on the calculated change.*

*9. A projection exposure apparatus comprising:*

*an illumination system that forms a secondary light source, of which a size or shape is changed, with light from a primary light source to illuminate a pattern with light from the secondary light source;*

*a projection optical system that projects an image of the pattern on a substrate; and*

*an imaging controller connected with the projection optical system, the imaging controller adjusting an optical property of the projection optical system based on one of a plurality of constants corresponding to different sizes or shapes of secondary light sources, which is selected in accordance with the changed size or shape so as to correct a change in the optical property caused by the change of the size or the shape.*

*10. An apparatus according to claim 9, wherein said imaging controller includes a device that adjusts pressure in a chamber located between said pattern and said substrate, said light irradiated from said pattern passing through said chamber.*

*11. An apparatus according to claim 10, wherein said imaging controller includes a calculator that calculates the change in said optical property by using said selected constant, the calculator controlling said device based on the calculated change.*

*12. A projection exposure method comprising the steps of:*

*changing a size or a shape of a secondary light source formed with light from a primary light source;*

*determining a constant used in adjusting a change in an optical property of a projection optical system in accordance with the changed size or shape of the secondary light source; and*

*illuminating a pattern with light from the changed secondary light source so as to expose a substrate with the illuminated pattern through the projection optical system of which the change in the optical property is corrected based on the determined constant.*

*13. A projection exposure method comprising the steps of:*

*changing a size or a shape of a secondary light source formed with light from a primary light source; and*

*adjusting an optical property of a projection optical system based on one of a plurality of constants corresponding to different sizes or shapes of secondary light sources, which is selected in accordance with the changed size or shape of the secondary light source so as to correct a change in the optical property caused by the change of the size or the shape.*

*14. A method according to claim 13, further comprising:*

*illuminating said pattern with light from said changed secondary light source so as to expose a substrate with the illuminated pattern through said projection optical system of which the optical property is corrected.*

*15. A method according to claim 13, wherein an optical distance between said pattern and said projection optical system is changed to adjust said optical property.*

*16. A method according to claim 13, wherein a refractive index in at least one of spaces between said pattern and a substrate exposed with said illuminated pattern is changed to adjust said optical property.*

*17. A projection exposure method comprising the steps of:*

*changing a size or a shape of an illumination source of which an image is substantially formed on a pupil plane of a projection optical system so as to illuminate a pattern with the changed illumination source;*

*adjusting a distance between the pattern and the projection optical system based on one of a plurality of constants corresponding to different sizes or shapes of illumination sources, which is selected in accordance with the changed size or shape of the illumination source so as to correct a change in an optical property of the projection optical system caused by the change of the size or the shape.*

*18. A semiconductor device manufacturing method comprising the steps of:*

*providing a wafer and a device pattern;*

*changing a size or a shape of an illumination source illuminating the pattern;*

*adjusting an optical property of a projection optical system based on a constant selected in accordance with the changed size or shape to compensate for a change*

*in the optical property caused by the change of the size or the shape; and*

*illuminating the pattern with the changed illumination source so as to transfer the illuminated pattern onto the wafer through the adjusted projection optical system.*

*19. A semiconductor device manufacturing apparatus comprising:*

*an illumination system that illuminates a device pattern with an illumination source of which a size or a shape is changed;*

*a projection system that projects an image of the pattern on a wafer and having a pupil plane on which an image of the illumination source is substantially formed; and*

*an adjusting system that adjusts an optical property of the projection system based on a constant selected in accordance with the changed size or shape of the illumination source to compensate for a change in the optical property caused by the change of the size or the shape.*

*20. A projection exposure method comprising the steps of:*

*changing a size or a shape of an illumination light; and*

*adjusting an optical property of a projection optical system based on one of a plurality of constants corresponding to different sizes or shapes of illumination lights, which is selected in accordance with the changed size or shape of the illumination light so as to correct a change in the optical property caused by the change of the size or the shape.*

*21. A projection exposure apparatus comprising:*

*an illumination system that outputs an illumination light, of which a size or shape is changed, to illuminate a pattern;*

*a projection optical system that projects an image of the pattern on a substrate; and*

*an imaging controller connected with the projection optical system, the imaging controller adjusting an optical property of the projection optical system based on one of a plurality of constants corresponding to different sizes or shapes of the illumination light, which is selected in accordance with the changed size or shape so as to adjust a change in the optical property caused by the change of the size or the shape.*

*22. A projection exposure apparatus comprising:*

*an illumination optical system that illuminates a pattern through an optical integrator, with illumination light from a light source;*

*a projection optical system that projects the illuminated pattern onto an object;*

*an optical device disposed on an optical path through which the illumination light passes to change an intensity distribution of the illumination light on a plane, in the illumination optical system, substantially conjugate with a pupil plane of the projection optical system; and*

*an adjusting system that adjusts the projection optical system so as to correct a change in an optical property of the projection optical system caused by the change of the intensity distribution.*

*23. An apparatus according to claim 22, wherein*

*said optical device includes a stop disposed between said pattern and said optical integrator.*

*24. An apparatus according to claim 22, wherein*

*said optical device includes an optical element disposed between said optical integrator and said light source.*

*25. A projection exposure method comprising:*

*changing an intensity distribution of light on a pupil plane of a projection optical system, generated from a pattern by irradiation of illumination light to expose an object with the light through the projection optical system; and*

*adjusting the projection optical system based on a parameter determined in accordance with the intensity distribution so as to correct a change in an optical property of the projection optical system caused by the change of the intensity distribution.*

*26. A method according to claim 25, wherein*

*a distance between said projection optical system and at least one of said pattern and said object is adjusted.*

*27. A method according to claim 25, wherein*

*said intensity distribution of light is changed by adjusting a distribution of said illumination light on a plane, in an illumination optical system to illuminate said pattern, substantially conjugate with the pupil plane of said projection optical system.*

*28. A method according to claim 25, wherein*

*said intensity distribution of light is changed by adjusting a numerical aperture of said projection optical system.*

*29. A projection exposure method comprising:*

*changing an intensity distribution of light on a pupil plane of a projection optical system, said light being generated from a pattern by irradiation of illumination light to expose an object with the light through the projection optical system; and*

*performing an imaging adjustment in accordance with the change of the intensity distribution in order to form a desired image on the object through the projection optical system.*

*30. A method according to claim 29, wherein the imaging adjustment compensates for a change of an optical property of the projection optical system that would be caused by the change of the intensity distribution.*

*31. A method according to claim 29, wherein the intensity distribution is changeable continuously.*

*32. A method according to claim 29, wherein said change of the intensity distribution is performed by using a zoom optical system disposed in an illumination system which directs the illumination light to said pattern.*

*33. A method according to claim 29, wherein said change of the intensity distribution is performed by changing an arrangement of optical elements disposed in an illumination system which directs the illumination light to said pattern.*

*34. A method according to claim 29, wherein said change of the intensity distribution is performed by expanding said illumination light.*

*35. A method according to claim 29, wherein said change of the intensity distribution includes a change of a numerical aperture of the projection optical system.*

*36. A method according to claim 29, wherein said change of the intensity distribution includes a change of a distribution of the light from a circular shape to an other shape.*

*37. A method according to claim 29, wherein said imaging adjustment includes an adjustment of the projection optical system.*

*38. A method according to claim 29, wherein said imaging adjustment includes a movement of a mask on which said pattern is formed.*

*39. A method according to claim 29, wherein said imaging adjustment includes a relative movement of the object and an image surface formed through the projection optical system.*

*40. A projection exposure apparatus comprising:*

*an illumination system having a plurality of optical elements that include an optical integrator and that are disposed in a path of illumination light from a light source;*

*an optical device disposed between the optical integrator and the light source in the illumination system, which changes an intensity distribution of light on a pupil plane of a projection optical system, said light being generated from a pattern by irradiation of the illumination light to expose an object with the light through the projection optical system; and*

*an adjustment system functionally associated with the optical device, that performs an imaging adjustment in accordance with the change in the intensity distribution in order to form a desired pattern image on the object through the projection optical system.*

*41. An apparatus according to claim 40, wherein said change of the intensity distribution includes a change of a distribution of the light from a circular shape to an other shape.*

*42. An apparatus according to claim 40, wherein said imaging adjustment includes an adjustment of the projection optical system.*

*43. An apparatus according to claim 40, wherein said imaging adjustment includes a movement of a mask on which said pattern is formed.*

*44. An apparatus according to claim 40, wherein said imaging adjustment includes a relative movement of the object and an image surface formed through the projection optical system.*

*45. A semiconductor device manufacturing method comprising:*

*providing a wafer and a device pattern;*

*changing an intensity distribution of light on a pupil plane of a projection optical system, the light being generated from the device pattern by irradiation of illumination light to expose the wafer with the light through the projection optical system; and*

*performing an imaging adjustment in accordance with the change of the intensity distribution in order to form a desired image on the wafer through the projection optical system.*

* * * * *